(12) United States Patent
Li

(10) Patent No.: US 11,641,761 B2
(45) Date of Patent: May 2, 2023

(54) BLACK MATRIX AND METHOD FOR MANUFACTURING THE SAME, AND COLOR FILTER SUBSTRATE AND METHOD FOR MANUFACTURING THE SAME

(71) Applicant: BEIJING XIAOMI MOBILE SOFTWARE CO., LTD., Beijing (CN)

(72) Inventor: Jian Li, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 30 days.

(21) Appl. No.: 17/203,018

(22) Filed: Mar. 16, 2021

(65) Prior Publication Data

US 2022/0037626 A1 Feb. 3, 2022

(30) Foreign Application Priority Data

Jul. 31, 2020 (CN) .......................... 202010762361.5

(51) Int. Cl.
*G02F 1/1335* (2006.01)

(52) U.S. Cl.
CPC ..... *H10K 50/865* (2023.02); *G02F 1/133512* (2013.01); *G02F 1/133514* (2013.01); *H10K 59/38* (2023.02)

(58) Field of Classification Search
CPC ... H01L 51/5284; H01L 51/56; H01L 27/322; H01L 27/3211; G02F 1/133512; G02F 1/133515; G02F 1/133516
See application file for complete search history.

(56) References Cited

U.S. PATENT DOCUMENTS

| 5,120,623 | A | 6/1992 | Brosig et al. |
| 2017/0269424 | A1* | 9/2017 | Long ................... G03F 7/2024 |
| 2018/0210281 | A1* | 7/2018 | Liu ........................ H01L 21/47 |
| 2019/0317363 | A1* | 10/2019 | Shiau ................ G02F 1/133516 |

OTHER PUBLICATIONS

European Patent Application No. 21165094.0 extended search and opinion dated Sep. 16, 2021, 6 pages.

* cited by examiner

*Primary Examiner* — Angela K Davison
(74) *Attorney, Agent, or Firm* — Cozen O'Connor

(57) ABSTRACT

The present disclosure provides a black matrix and a method for manufacturing the same, and a color filter substrate and a method for manufacturing the same. The method for manufacturing the black matrix includes: providing a substrate; forming a sacrificial layer on the substrate, the sacrificial layer including a plurality of sacrificial patterns; forming a light shielding film layer on the sacrificial layer, wherein the light shielding film layer includes a plurality of first light shielding patterns and a plurality of second light shielding patterns, and each of the second light shielding patterns and an adjacent first light shielding pattern are separated by the sacrificial pattern; removing the sacrificial layer and the second light shielding pattern and forming the black matrix.

20 Claims, 3 Drawing Sheets

BLACK MATRIX AND METHOD FOR MANUFACTURING THE SAME, AND COLOR FILTER SUBSTRATE AND METHOD FOR MANUFACTURING THE SAME

CROSS-REFERENCE TO RELATED APPLICATION

This application is based upon and claims priority to Chinese Patent Application Serial No. 202010762361.5, filed on Jul. 31, 2020, the entire contents of which are incorporated herein by reference.

FIELD

The present disclosure relates to the field of display technologies, and more particularly, to a black matrix and methods for manufacturing the same, a color filter substrate and methods for manufacturing the same.

BACKGROUND

Black Matrix is a kind of shielding structure commonly used in the display field. During the manufacturing process of black matrix, because the black matrix is made of a black material, it may block the alignment structure, which makes it difficult to accurately align the black matrix, resulting in a small process window, low position accuracy of the black matrix, and poor display effect. At present, improvements are mainly made by improving materials and combining different exposure alignment forms, but the improvements depend on the development progress of the manufacturer of the material, the actual improvement effect is limited, and the change of the alignment form also results in a restriction on the device.

SUMMARY

In order to solve the problems in the related art, the present disclosure provides a black matrix and a method for manufacturing the same, a color film substrate and a method for manufacturing the same.

The present disclosure provides a method for manufacturing a black matrix, including: providing a substrate; forming a sacrificial layer on the substrate, the sacrificial layer including a plurality of sacrificial patterns; forming a light shielding film layer on the sacrificial layer, wherein the light shielding film layer includes a plurality of first light shielding patterns and a plurality of second light shielding patterns, and each of the second light shielding patterns and an adjacent first light shielding pattern are separated by the sacrificial pattern; removing the sacrificial layer and the second light shielding pattern and forming the black matrix.

The present disclosure further provides a method for manufacturing a color filter substrate, including: forming the black matrix by the above method for manufacturing the black matrix;

forming a plurality of color resists on the black matrix, each of the color resists being located between two adjacent first light shielding patterns.

The present disclosure further provides a black matrix, formed by the above method for manufacturing the black matrix.

The present disclosure further provides a color filter substrate including the above black matrix.

The present disclosure further provides a display screen including the above color filter substrate.

The present disclosure further provides an electronic device including the above display screen.

DETAILED DESCRIPTION

Figure 1:
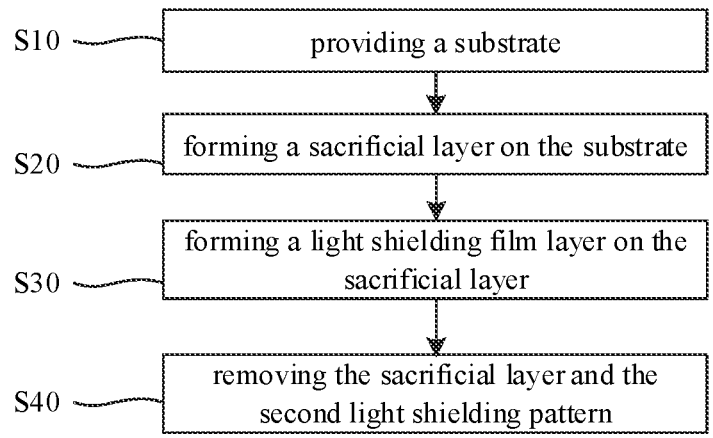
FIG. 1 is a schematic flowchart of a method for manufacturing a black matrix according to an embodiment of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of devices and methods consistent with aspects related to the disclosure as recited in the appended claims.

The terms used in the present disclosure are for the purpose of describing specific embodiments and are not intended to limit the present disclosure. Unless otherwise defined, the technical terms or scientific terms used in the present disclosure shall have the usual meanings understood by those ordinary skills in the art. The "first", "second" and similar words used in the specification and claims of the present disclosure do not denote any order, quantity or importance, but are used to distinguish different components. Similarly, similar words such as "one" or "a/an" do not mean a quantity limit, but mean that there is at least one. "A plurality of" or "several" means two or more. Unless otherwise indicated, similar words such as "front", "rear", "lower" and/or "upper" are for convenience of description, and are not limited to one position or one spatial orientation. "Including" or "comprising" and other similar words mean that the elements or items before "including" or "comprising" contain the elements or items after "including" or "comprising" and their equivalents, and do not exclude other elements or objects. Similar words such as "connected" or "coupled" are not limited to physical or mechanical connections, and may include electrical connections, whether direct or indirect. The singular forms of "a", "said" and "the" used in the specification and appended claims of the present disclosure are also intended to include plural forms, unless the context clearly indicates other meanings. It should also be understood that the term "and/or" used herein refers to and includes any or all possible combinations of one or more associated listed items.

The present disclosure provides a method for manufacturing a black matrix. The method for manufacturing the black matrix includes: providing a substrate; forming a sacrificial layer on the substrate, the sacrificial layer including a plurality of sacrificial patterns; and forming a light shield film layer on the sacrificial layer, in which the light shielding film layer includes a plurality of first light shielding patterns and a plurality of second light shielding patterns, the second light shielding pattern and the adjacent first light shielding pattern are separated by the sacrificial pattern; removing the sacrificial layer and the second light shielding pattern to form the black matrix. The sacrificial layer refers to a film layer that is formed before the target film layer (such as a light shielding film layer) is manufactured and removed after the target film layer is formed, that is, there is no sacrificial layer in the final product. The sacrificial layer is mainly used for separation, for example, it is used to separate the first light shielding pattern and the second light shielding pattern. The sacrifice pattern corresponds to the pattern of the sacrifice layer.

Referring to FIGS. 1 to 7, in this embodiment, the method for manufacturing a black matrix includes the following steps.

Step S10: a substrate 1 is provided.

Step S20: a sacrificial layer 2 is formed on the substrate 1, in which the sacrificial layer 2 includes a plurality of sacrificial patterns 20.

Step S30: a light shielding film layer 3 is formed on the sacrificial layer 2, in which the light shielding film layer 3 includes a plurality of first light shielding patterns 31 and a plurality of second light shielding patterns 32, and each of the second light shielding patterns 32 and an adjacent first light shielding pattern 31 are separated by the sacrificial pattern 20.

Step S40: the sacrificial layer 2 and the second light shielding pattern 32 are removed, the first light shielding pattern 31 is remained, and the black matrix is formed.

Figure 2:
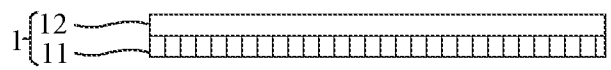
FIG. 2 is a schematic cross-sectional view of a substrate according to an embodiment of the present disclosure.

Referring to FIG. 2, in this embodiment, the substrate 1 and the sacrificial layer 2 are arranged along a first direction Y. The substrate 1 includes a display substrate 11 and an encapsulation layer 12 arranged along the first direction Y, and the display substrate 11 is, for example, an OLED display substrate. The black matrix can reduce the effect of the reflection, so that the black matrix is formed on the encapsulation layer 12 and a circular polarizer structure can be omitted, that is, the so-called POL-less technology (non-polarizer technology). The omitting of the circular polarizer structure can reduce the thickness of the OLED display screen (including the OLED display substrate and the black matrix) to a large extent, and the setting of the black matrix is also beneficial to improve the display brightness and contrast of the OLED display screen. When the OLED display substrate is a flexible OLED display substrate, the requirements for thickness are higher, so the POL-less technology is more suitable for flexible OLED display screens.

Understandably, the OLED display substrate can realize basic display functions, including structures such as an anode, a light-emitting structure, and a cathode, and normal display may be achieved when the anode is driven by a voltage. In some embodiments, the display substrate 11 may also be a liquid crystal display substrate, in which case the encapsulation layer 12 is not provided on the substrate. The liquid crystal display substrate may include an array substrate, a liquid crystal layer, and an opposite substrate. The opposite substrate does not include a color filter substrate or the color filter substrate has not been formed. The method for manufacturing the black matrix can be used to manufacture the black matrix of the color filter substrate. In some other embodiments, the substrate 1 may also be a single film layer without a display function, or a laminated structure of a plurality of film layers.

Figure 3:
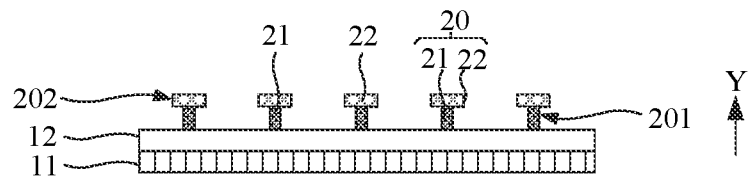
FIG. 3 is a schematic cross-sectional view of forming a sacrificial layer on the substrate according to an embodiment of the present disclosure.

Referring to FIG. 3, the step S20 includes: forming a first sub-film layer 201 on the substrate 1, the first sub-film layer 201 including a plurality of first sacrificial patterns 21; forming a second sub-film layer 202 on the first sub-film layer 201, the second sub-film layer 202 including a plurality of second sacrificial patterns 22.

It can be understood that the formation process of the first sub-film layer 201 and the second sub-film layer 202 includes a deposition process and a patterning process.

The sacrificial layer 2 is formed by the first sub-film layer 201 and the second sub-film layer 202, and the sacrificial pattern 20 is formed by the first sacrificial pattern 21 and the second sacrificial pattern 22 located on the first sacrificial pattern 21, the sacrificial pattern 20 is roughly in the shape of a "T". The first sub-film layer 201 and the second sub-film layer 202 may be made of the same material, or may be made of different materials. In this embodiment, different materials are preferred. For example, the material of the first sub-film layer 201 includes a negative photoresist, and the material of the second sub-film layer 202 can be selected from conventional organic materials or inorganic materials. In the subsequent step S40, after the first sub-film layer 201 is dissolved by a specific developer, the second sub-film layer 202 and the second light shielding pattern 32 can be peeled off along with the first sub-film layer 201.

In step S20, cross linking will be occurred for an exposed part of the negative photoresist, so that the exposed part of the negative photoresist has a strengthened structure and is difficult to be dissolved, while an unexposed part of the negative photoresist can be dissolved by a conventional developer (such as an n-heptane solution), so that the unexposed part of the negative photoresist is easily removed. Since the negative photoresist is not made of a black material, it can be patterned by exposure, and it is easier to obtain patterns with higher accuracy and better quality, that is, the first sacrificial pattern 21 and the second sacrificial pattern 22.

Figure 4:
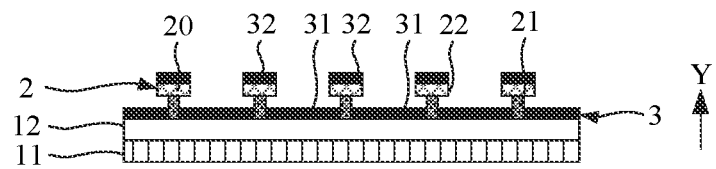
FIG. 4 is a schematic cross-sectional view of forming a light shielding layer on the sacrificial layer.

Referring to FIG. 4, the step S30 includes the following steps.

Step S31: a light shielding film layer 3 is formed on the sacrificial layer 2.

Step S32: the light shielding film layer 3 is exposed.

Referring to FIGS. 3 and 4, the first sacrificial pattern 21 is located between two adjacent first light shielding patterns 31, and the second light shielding pattern 32 is located on the second sacrificial pattern 22. An orthographic projection of the first sacrificial pattern 21 on the substrate 1 is located within an orthographic projection of the second sacrificial pattern 22 on the substrate 1, that is, a circumferential size of the first sacrificial pattern 21 is smaller than that of the second sacrificial pattern 22, in other words, there is a segment step at the connection area between the first sacrificial pattern 21 and the second sacrificial pattern 22, and the circumferential direction is perpendicular to the first direction Y. During the deposition process of the light shielding film layer 3, the movement direction of the excited particles is random, so that the excited particles can reach below the second sacrificial pattern 22.

Figure 5:
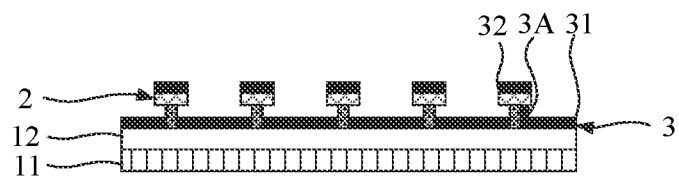
FIG. 5 is a schematic cross-sectional view of forming the light shielding layer on the substrate, in which a part of the light shielding film layer between the first light shielding pattern and the second light shielding pattern is not removed.

Since there is a segment step at the connection area between the first sacrificial pattern 21 and the second sacrificial pattern 22, the light shielding film layer 3 is naturally disconnected at the sacrificial pattern 20 (mainly at the side surface of the first light shielding pattern 31). Referring to FIG. 5, if there is still a small amount of light shielding film layer 3A on the sacrificial pattern 20 and the small amount of light shielding film layer 3A is located between the first light shielding pattern 31 and the second light shielding pattern 32, a part of the light shielding film layer between the first light shielding pattern 31 and the second light shielding pattern 32 can be removed by an ashing process. In other words, after the ashing process, the first light shielding pattern 31 and the adjacent second light shielding pattern 32 are completely separated. Optionally, the ashing process can be a plasma ashing treatment process.

In order to prevent the ashing process from eliminating the first light shielding pattern while eliminating the remaining small amount of light shielding film layer 3A, and further affecting the light shielding effect, the thickness of the first light shielding layer (dimension in the first direction Y) may be increased.

Figure 6:
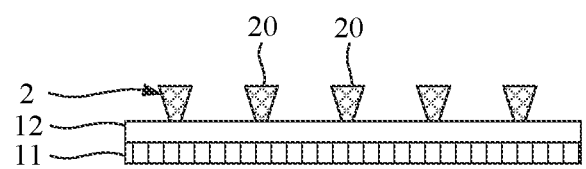
FIG. 6 is another schematic cross-sectional view of forming the sacrificial layer on the substrate according to an embodiment of the present disclosure.

Referring to FIG. 6, in another embodiment, the step S20 includes: coating a negative photoresist on the substrate 1; partially exposing the negative photoresist; and etching an unexposed part of the negative photoresist, and removing the unexposed part of the negative photoresist to form the plurality of sacrificial patterns 20.

In this embodiment, the sacrificial pattern 20 is approximately an inverted trapezoid, and the light shielding film layer 3 can also be disconnected at the sacrificial pattern 20 (mainly at the side surface of the trapezoid). If there is a part of light shielding film layer between the first light shielding pattern 31 and the second light shielding pattern 32, the part of light shielding film layer can be removed by an ashing process. Compared with the foregoing embodiment, the patterning process is implemented once in this embodiment, which is beneficial to simplify the process and reduce the cost.

In other embodiments, the sacrificial pattern can also have other shapes that are narrow at the bottom and wide at the top (one end close to the substrate is narrow, and the other end far away from the substrate is wide), as long as the first light shielding pattern 31 and the second light shielding pattern 32 can be separated.

Figure 7:
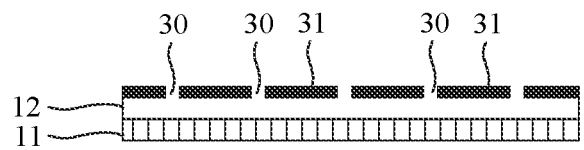
FIG. 7 is a schematic cross-sectional view of peeling off the sacrificial layer and the second light shielding pattern.
Figure 8:
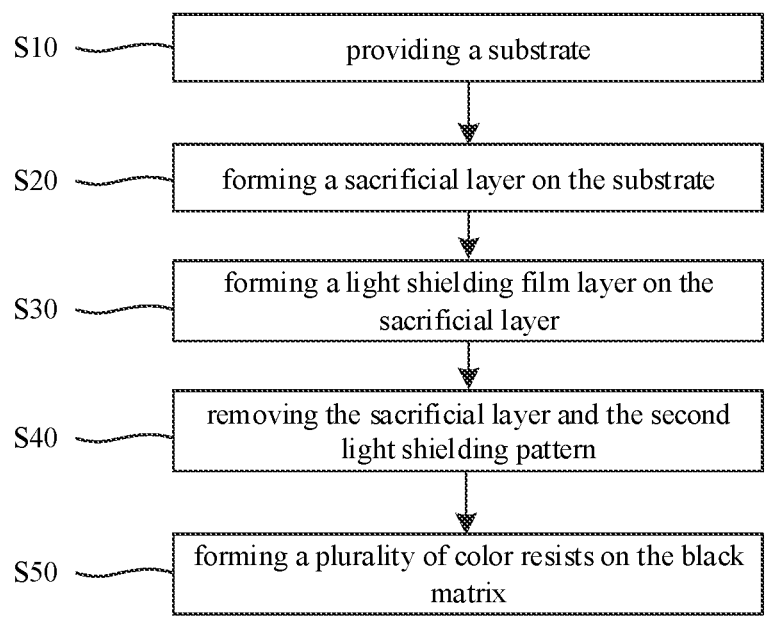
FIG. 8 is a schematic flowchart of a method for manufacturing a color filter substrate according to an embodiment of the present disclosure.
Figure 9:
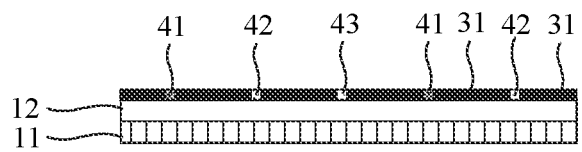
FIG. 9 is a schematic cross-sectional view of forming a color resist on the black matrix.

Referring to FIG. 7, the step S40 includes: dissolving the first sacrificial pattern 21 and the second sacrificial pattern 22 with a specific developer, and cleaning and peeling off the first sacrificial pattern 21, the second sacrificial pattern 22, and the second light shielding pattern 32 arranged on the second sacrificial pattern 22.

In this embodiment, the negative photoresist can be made of an organic photosensitive material that can be dissolved in a specific developer, such as polyisoprene. The material of the corresponding specific developer includes xylene or tetramethylammonium hydroxide (TMAH). During the development process, xylene or tetramethylammonium hydroxide solution will not cause damage to other structures, such as the substrate and the light shielding film layer. Of course, the material of the negative photoresist can also be selected from materials such as polycinnamates and polyhydrocarbons. In other embodiments, in addition to the negative photoresist, the sacrificial layer may also contain other sacrificial materials, such as sensitizers and solvents, and the sacrificial layer and the negative photoresist are peeled off together in the subsequent step S40.

It is easy to understand that since the first light shielding pattern 31 and the adjacent second light shielding pattern 32 are completely separated, and the second light shielding pattern 32 is arranged on the second sacrificial pattern 22, when the second sacrificial pattern 22 is dissolved by the specific developer, the second light shielding pattern 32 will be peeled off along with the first sacrificial pattern 21 and the second sacrificial pattern 22.

An opening 30 is formed between two adjacent first light shielding patterns 31, and an area where the first sacrificial pattern 21 is located in an area where the opening 30 is located. Since the first sacrificial pattern 21 has higher position accuracy and better quality, the opening 30 has higher position accuracy and better quality, so that the accurate positioning of the black matrix is realized and it is not necessary to set up an additional alignment structure (there is no such a problem that the alignment structure is shielded by the black matrix), which is beneficial to improve the position accuracy and resolution of the black matrix, reduce the uneven display of different display areas caused by the difference of the black matrix, thereby improving the display effect of the display screen including the black matrix.

On the other hand, the present disclosure also provides a method for manufacturing a color filter substrate. Referring to FIGS. 3, 4 and 7-9, the method for manufacturing the color filter substrate includes the following steps.

Step S10: a substrate 1 is provided.

Step S20: a sacrificial layer 2 is formed on the substrate 1, in which the sacrificial layer 2 includes a plurality of sacrificial patterns 20.

Step S30: a light shielding film layer 3 is formed on the sacrificial layer 2, in which the light shielding film layer 3 includes a plurality of first light shielding patterns 31 and a plurality of second light shielding patterns 32, and each of the second light shielding patterns 32 and an adjacent first light shielding pattern 31 are separated by the sacrificial pattern 20.

Step S40: the sacrificial layer 2 and the second light shielding pattern 32 are removed, the first light shielding pattern 31 is remained, and a black matrix is formed.

Step S50: a plurality of color resists is formed on the black matrix, each of the color resists being located between two adjacent first light shielding patterns 31. It should be noted that a plurality of color resists are formed on the black matrix means that the color resists are made after the black matrix is formed, and does not indicate the positional relationship therebetween.

In this embodiment, the color resist is a red color resist 41, a green color resist 42 or a blue color resist 43. When the substrate 1 includes an OLED display substrate, the black matrix of the color film substrate is beneficial to reduce the reflected light on the surface of the OLED display, and the color resist of the color film substrate is beneficial to increase the color gamut of the OLED display, thereby improving the display effect of the OLED display. When the substrate 1 includes a liquid crystal display substrate, the color filter substrate may directly be a part of the opposite substrate (usually including a base substrate, a common electrode, etc.) of the liquid crystal screen.

In addition, the present disclosure also provides a color filter substrate, which includes the black matrix as described above. The color filter substrate is manufactured by the method for manufacturing the color filter substrate.

The present disclosure also provides a display screen, which includes the color filter substrate and the display substrate. When the display substrate 11 is an OLED display substrate, the display screen corresponds to an OLED display screen, and the display screen also includes an encapsulation layer 12 that encapsulates the display substrate 11. The black matrix of the color film substrate is beneficial to reduce the reflected light on the surface of the OLED display screen, and the color resist of the color film substrate is beneficial to increase the color gamut of the OLED display screen, thereby improving the display effect of the OLED display. When the display substrate 11 is a liquid crystal display substrate, the display screen corresponds to a liquid crystal display screen. Generally, the encapsulation layer is not arranged on the liquid crystal display substrate.

The present disclosure also provides an electronic device including the display screen as described above. The electronic device is a device with a display screen such as a mobile phone and a tablet computer. Of course, the electronic device also includes components such as a processor, a memory, a power supply component, and a communication component, which will not be described in detail in this embodiment.

By providing the sacrificial pattern, the first light shielding pattern and the second light shielding pattern are separated, so that the second light shielding pattern can be removed together with the sacrificial layer, thereby realizing the patterning of the light shielding film layer and obtaining a black matrix with higher position accuracy.

The above descriptions are only the preferred embodiments of the present disclosure, and do not limit the present disclosure in any form. Although the present disclosure has been disclosed as above in preferred embodiments, it is not intended to limit the present disclosure. A person skilled in the art, without departing from the scope of the technical solution of the present disclosure, may make slight changes or modifications into equivalent implementations with equivalent changes, but any content that does not depart from the technical solution of the present disclosure, any simple modifications, equivalent changes and modifications to the above embodiments based on this technical essence of the disclosure still fall within the scope of the technical solutions of the present disclosure.

What is claimed is:

1. A method for manufacturing a black matrix, comprising:
    providing a substrate;
    forming a sacrificial layer on the substrate, the sacrificial layer comprising a plurality of sacrificial patterns, each of the sacrificial patterns having one end close to the substrate and another end farther away from the substrate, wherein the end farther away from the substrate is wider than the end close to the substrate;
    forming a light shielding film layer on the sacrificial layer, wherein the light shielding film layer comprises a plurality of first light shielding patterns and a plurality of second light shielding patterns, and each of the second light shielding patterns and an adjacent first light shielding pattern are separated by the sacrificial pattern;
    removing the sacrificial layer and the second light shielding pattern to form the black matrix.

2. The method according to claim 1, wherein forming the sacrificial layer on the substrate comprises:
    coating a negative photoresist on the substrate;
    partially exposing the negative photoresist; and
    etching an unexposed part of the negative photoresist, and removing the unexposed part of the negative photoresist to form the plurality of sacrificial patterns.

3. The method according to claim 1, wherein the sacrificial pattern comprises a first sacrificial pattern and a second sacrificial pattern located on the first sacrificial pattern, and an orthographic projection of the first sacrificial pattern on the substrate is located within an orthographic projection of the second sacrificial pattern on the substrate.

4. The method according to claim 3, wherein the first sacrificial pattern is located between two adjacent first light shielding patterns, and the second light shielding pattern is located on the second sacrificial pattern.

5. The method according to claim 4, wherein forming the sacrificial layer on the substrate comprises:
    forming a first sub-film layer on the substrate, the first sub-film layer including a plurality of first sacrificial patterns;
    forming a second sub-film layer on the first sub-film layer, the second sub-film layer including a plurality of second sacrificial patterns.

6. The method according to claim 4, wherein size of the light shielding film layer in a first direction is smaller than size of the first sacrificial pattern in the first direction, and the substrate and the sacrificial layer are arranged along the first direction.

7. The method according to claim 6, comprising:
    removing a part of the light shielding film layer located between the first light shielding pattern and the second light shielding pattern by an ashing process when the light shielding film layer is formed on the sacrificial layer.

8. The method according to claim 1, wherein removing the sacrificial layer and the second light shielding pattern comprises:
    dissolving the sacrificial layer by a developer, and cleaning and peeling off the sacrificial layer and the second light shielding pattern arranged on the sacrificial layer.

9. The method according to claim 8, wherein the sacrificial layer comprises polyisoprene, and the developer comprises xylene or tetramethylammonium hydroxide.

10. A black matrix prepared according to the method of claim 1.

11. A color filter substrate, comprising a black matrix prepared according to the method of claim 1.

12. A method for manufacturing a color filter substrate, comprising:
    providing a substrate;
    forming a sacrificial layer on the substrate, the sacrificial layer comprising a plurality of sacrificial patterns, each of the sacrificial patterns having one end close to the substrate and another end farther away from the substrate, wherein the end farther away from the substrate is wider than the end close to the substrate;
    forming a light shielding film layer on the sacrificial layer, wherein the light shielding film layer comprises a plurality of first light shielding patterns and a plurality of second light shielding patterns, and each of the second light shielding patterns and an adjacent first light shielding pattern are separated by the sacrificial pattern;
    removing the sacrificial layer and the second light shielding pattern and forming the black matrix;
    forming a plurality of color resists on the black matrix, each of the color resists being located between two adjacent first light shielding patterns.

13. The method according to claim 12, wherein the substrate comprises an OLED display substrate or a liquid crystal display substrate.

14. The method according to claim 12, wherein forming the sacrificial layer on the substrate comprises:
coating a negative photoresist on the substrate;
partially exposing the negative photoresist; and
etching an unexposed part of the negative photoresist, and removing the unexposed part of the negative photoresist to form the plurality of sacrificial patterns.

15. The method according to claim 12, wherein the sacrificial pattern comprises a first sacrificial pattern and a second sacrificial pattern located on the first sacrificial pattern, and an orthographic projection of the first sacrificial pattern on the substrate is located within an orthographic projection of the second sacrificial pattern on the substrate.

16. The method according to claim 15, wherein the first sacrificial pattern is located between two adjacent first light shielding patterns, and the second light shielding pattern is located on the second sacrificial pattern.

17. The method according to claim 16, wherein forming the sacrificial layer on the substrate comprises:

forming a first sub-film layer on the substrate, the first sub-film layer including a plurality of first sacrificial patterns;
forming a second sub-film layer on the first sub-film layer, the second sub-film layer including a plurality of second sacrificial patterns.

18. The method according to claim 16, wherein size of the light shielding film layer in a first direction is smaller than size of the first sacrificial pattern in the first direction, and the substrate and the sacrificial layer are arranged along the first direction.

19. The method according to claim 18, comprising:
removing a part of the light shielding film layer located between the first light shielding pattern and the second light shielding pattern by an ashing process when the light shielding film layer is formed on the sacrificial layer.

20. The method according to claim 12, wherein removing the sacrificial layer and the second light shielding pattern comprises:
dissolving the sacrificial layer by a developer, and cleaning and peeling off the sacrificial layer and the second light shielding pattern arranged on the sacrificial layer.

* * * * *